United States Patent
Osaki et al.

(10) Patent No.: US 11,607,871 B2
(45) Date of Patent: Mar. 21, 2023

(54) PARTITION WALL FOR FORMATION OF LIPID BILAYER MEMBRANE, AND METHOD FOR PRODUCING SAME

(71) Applicants: KANAGAWA INSTITUTE OF INDUSTRIAL SCIENCE AND TECHNOLOGY, Ebina (JP); TORAY ENGINEERING CO., LTD., Tokyo (JP)

(72) Inventors: Toshihisa Osaki, Ebina (JP); Masatoshi Hayakawa, Ebina (JP); Koki Kamiya, Ebina (JP); Miharu Kaneko, Kawagoe (JP); Hideo Uehara, Kawagoe (JP); Katsufumi Araki, Kawagoe (JP); Ayumi Konda, Kawagoe (JP); Hajime Hirata, Otsu (JP); Toshiyuki Ura, Otsu (JP)

(73) Assignees: KANAGAWA INSTITUTE OF INDUSTRIAL SCIENCE AND TECHNOLOGY, Ebina (JP); TORAY ENGINEERING CO., LTD., Tokyo (JP)

( * ) Notice: Subject to any disclaimer, the term of this patent is extended or adjusted under 35 U.S.C. 154(b) by 261 days.

(21) Appl. No.: 16/960,439

(22) PCT Filed: Jan. 15, 2019

(86) PCT No.: PCT/JP2019/000927
§ 371 (c)(1),
(2) Date: Jul. 7, 2020

(87) PCT Pub. No.: WO2019/142784
PCT Pub. Date: Jul. 25, 2019

(65) Prior Publication Data
US 2020/0346444 A1 Nov. 5, 2020

(30) Foreign Application Priority Data

Jan. 19, 2018 (JP) .............................. JP2018-007076

(51) Int. Cl.
*B32B 27/28* (2006.01)
*B32B 38/10* (2006.01)
(Continued)

(52) U.S. Cl.
CPC ........ *B32B 27/281* (2013.01); *B32B 37/0053* (2013.01); *B32B 38/0036* (2013.01);
(Continued)

(58) Field of Classification Search
CPC .............. B32B 27/281; B32B 37/0053; B32B 38/0036; B32B 38/10; B32B 2309/68;
(Continued)

(56) References Cited

U.S. PATENT DOCUMENTS 6,863,833 B1 3/2005 Bloom et al.
2008/0311375 A1* 12/2008 Harnack .............. B01D 67/003
428/315.7
(Continued)

FOREIGN PATENT DOCUMENTS

JP 2011-149868 A 8/2011
JP 2012-81405 A 4/2012
(Continued)

OTHER PUBLICATIONS

Ji-Song—polyimide film by wet etching—J-Stage—vol. 125—2005 (Year: 2005).*
(Continued)

*Primary Examiner* — Cynthia L Schaller
(74) *Attorney, Agent, or Firm* — Birch, Stewart, Kolasch & Birch, LLP

(57) ABSTRACT

Disclosed are a separator for lipid bilayer membrane formation capable of forming a lipid bilayer membrane with
(Continued)

excellent properties, wherein the separator for lipid bilayer membrane formation has sufficient mechanical strength and can be easily manufactured in a large scale by using a general-purpose machine without need of using an expensive machine, and a method of producing the separator. The separator for lipid bilayer membrane formation includes a thin film having one or more through holes and made of a resin capable of being wet-etched, and reinforcing layers covering both surfaces of the thin film and made of a resin capable of being wet-etched. The reinforcing layers cover the whole area of the thin film, except for the through holes and the peripheries thereof, and each through hole has a tapered cross-sectional shape.

4 Claims, 2 Drawing Sheets

(51) Int. Cl.
  *G03F 7/11*    (2006.01)
  *G03F 7/00*    (2006.01)
  *G03F 7/40*    (2006.01)
  *G03F 7/095*   (2006.01)
  *B32B 38/00*   (2006.01)
  *B32B 37/00*   (2006.01)
  *G03F 7/42*    (2006.01)
(52) U.S. Cl.
  CPC ............ *B32B 38/10* (2013.01); *G03F 7/0035* (2013.01); *G03F 7/0957* (2013.01); *G03F 7/11* (2013.01); *G03F 7/40* (2013.01); *G03F 7/42* (2013.01); *B32B 2309/68* (2013.01); *B32B 2379/08* (2013.01)
(58) Field of Classification Search
  CPC . B32B 2379/08; G03F 7/0035; G03F 7/0957; G03F 7/11; G03F 7/40; G03F 7/42
  See application file for complete search history.

(56) References Cited

U.S. PATENT DOCUMENTS

| | | |
|---|---|---|
| 2010/0213070 A1 | 8/2010 | Oki et al. |
| 2016/0062239 A1 | 3/2016 | Morgan et al. |

FOREIGN PATENT DOCUMENTS

| | | | | |
|---|---|---|---|---|
| JP | 2015-077559 | * | 4/2015 | ............ B01J 19/00 |
| JP | 2015-77559 A | | 4/2015 | |
| WO | WO 2010/023848 A1 | | 3/2010 | |
| WO | WO 2011/043008 A1 | | 4/2011 | |

OTHER PUBLICATIONS

Claes—wet strip acrylates—ECS Trans.—2007 (Year: 2007).*
Kalsi—Jap.Pat. D3—Shaped Apertures in photoresist films lipid bilayers—Biophys.J.—2014 (Year: 2014).*
Yasuga—JP 2015-077559 A—Jap.Pat. D1—Original—2015 (Year: 2015).*
Yasuga et al., JP2015077559A Machine Translation of Description (EPO/Google) (Year: 2022).*
Hirano-Iwata et al., "Free-Standing Lipid Bilayers in Silicone Chips—Membrane Stabilization Based on Microfrabricated Apertures with a Nanometer-Scale Smoothness," Langmuir, vol. 26, No. 3, 2010 (published online Oct. 2, 2009), pp. 1949-1952.
Kalsi et al., "Shaped Apertures in Photoresist Films Enhance the Lifetime and Mechanical Stability of Suspended Lipid Bilayers," Biophysical Journal, vol. 106, No. 8, Apr. 2014, pp. 1650-1659.
Kawano et al., "Automated Parallel Recordings of Topologically Identified Single Ion Channels," Scientific Reports, vol. 3, No. 1995, Jun. 17, 2013, pp. 1-7.
Extended European Search Report dated Oct. 27, 2021 for Application No. 19740977.4.
Kawano et al., "A Parylene Nanopore for Stable Planer Lipid Bilayer Membranes", IEEE 23rd International Conference on IEEE, 2010, pp. 923-926.

* cited by examiner

PARTITION WALL FOR FORMATION OF LIPID BILAYER MEMBRANE, AND METHOD FOR PRODUCING SAME

TECHNICAL FIELD

The present invention relates to a separator for lipid bilayer membrane formation, which is used within a device for lipid bilayer membrane formation, the device containing the separator for lipid bilayer membrane formation, and a method of producing the separator.

BACKGROUND ART

Proteins on cell membrane (membrane proteins) account for the majority of targets of drug discovery, and it is considered important to study and analyze the functions of those proteins not only in basic science but also in the field of medicine. A technology has been developed for artificially forming cell membranes (lipid bilayer membranes) on microdevices, one of whose purposes is to measure the functions of such membrane proteins. As the technology for lipid bilayer membrane-integrated microdevice develops, research relating to use of excellent functions of membrane proteins is increasingly conducted, and research focusing on application of artificial cell membranes as sensors in the engineering field is also becoming popular.

A lipid bilayer membrane is formed on a polymer thin film with a micropore of a diameter ranging from tens to hundreds micrometer or at the tip of a glass capillary. The method used for forming a micropore in a thin film has shifted from an old method in which a Teflon (registered trademark) thin film is pierced with a heated needle to a method in which a micromachining technique is used to enable control of the size and shape of each pore. Previous studies have indicated that the characteristics, such as the size and shape of the pore and the thickness of the thin film, have influence on the properties and performance of the formed lipid bilayer membrane.

With regard to a device for lipid bilayer membrane formation, a method for forming a lipid bilayer membrane is known, in which a lipid monolayer-forming solution is added to each of chambers that are separated by a separator with a through hole(s) and then the two lipid monolayers are contacted at a through hole(s) in the separator (Patent Document 1). It is known advantageous if each through hole in the separator has a tapered shape (in which the hole diameter varies continuously and one-sidedly along the thickness direction of the separator), in the formation of a lipid bilayer membrane with excellent properties (Non-Patent Document 1). Additionally, the thickness of each through hole in the separator is desirably as thin as about 5 µm to 30 µm to form a lipid bilayer membrane with excellent properties. However, such a thin membrane has low mechanical strength and is difficult to handle. As a method to resolve the mechanical strength issue in such a film with a through hole(s) of a tapered shape, Non-Patent Document 2 describes use of a micromachining technique to form a silicon nitride film on a silicon substrate and subsequent formation of through holes on the silicon nitride film. Additionally, use of a self-supporting film that is composed of parylene, a para-xylylene-based polymer, as a separator is also known (Patent Document 2). Furthermore, a separator including a parylene film with multiple through holes is also known, in which an adhesive is used to attach reinforcing films to both sides of the parylene film, except for the areas covering the through holes (Non-Patent Document 3).

PRIOR ART DOCUMENTS

Patent Documents

Patent Document 1: JP 2012-81405 A
Patent Document 2: JP 2011-149868 A

Non-Patent Documents

Non-Patent Document 1: Kalsi et al., Biophys. J., 2014, 106, 1650-1659.
Non-Patent Document 2: Hirano-Iwata et al., Langmuir, 2010, 26, 1949-1952.
Non-Patent Document 3: Kawano et al., Sci. Rep., 2013, 3, 1996.

SUMMARY OF THE INVENTION

Problems to be Solved by the Invention

The method described in Non-Patent Document 2 is a method that utilizes a micromachining technique used for the manufacture of semiconductor devices and needs expensive semiconductor manufacturing equipment and also requires sputtering, which is a gaseous reaction, to be conducted, and is thus characterized by a complicated production process. Moreover, in the method described in Patent Document 2, each through hole formed in a parylene film is not tapered. Furthermore, the separator described in Non-Patent Document 3 has through holes with a non-tapered shape and reinforcing films attached with an adhesive, which should be dried. Thus, the production of the separator requires skills and time and is unsuitable for large-scale productions. Moreover, the mechanical strength in the vicinity of the through holes may be insufficient because vicinities of not all of the through holes are reinforced.

An object of the present invention is to provide a separator for lipid bilayer membrane formation capable of forming a lipid bilayer membrane with excellent properties, wherein the separator for lipid bilayer membrane formation has sufficient mechanical strength and can be easily manufactured in a large scale by using a general-purpose machine without need of using an expensive machine, and to provide a method of producing the same.

Means for Solving the Problem

The inventors intensively studied and discovered that the above-described object was achieved by forming a thin film with through holes from a resin capable of being wet-etched, forming reinforcing layers made of a resin capable of being wet-etched, covering the whole area of the thin film on both surfaces, except for the through holes and the peripheries thereof, and designing the through holes to have a tapered cross-sectional shape to complete the present invention.

That is, the present invention provides the followings.
(1) A separator for forming a lipid bilayer membrane, comprising a thin film having one or more through holes and made of a resin capable of being wet-etched, and reinforcing layers covering both surfaces of said thin film and made of a resin capable of being wet-etched, wherein said reinforcing layers cover the whole area of said thin film, except for said through holes and peripheries thereof, and each of said through holes has a tapered cross-sectional shape.

(2) The separator according to (1), wherein said thin film is composed of a polyimide resin.

(3) The separator according to (1) or (2), wherein said reinforcing layers are composed of a polyimide resin.

(4) The separator according to any one of (1) to (3), wherein said reinforcing layers have a thickness of 20 μm to 200 μm.

(5) The separator according to any one of (1) to (4), wherein the periphery of each of said through holes has a calculated diameter ranging from 5 to 50 times greater than the thickness of said reinforcing layers.

(6) The separator according to any one of (1) to (5), wherein the taper angle of said through holes is not more than 80 degrees.

(7) The separator according to any one of (1) to (6), wherein the ratio of the thickness of said thin film to the diameter of said through holes ranges from 1/50 to 1/5.

(8) The separator according to any one of (1) to (7), wherein said thin film has a thickness of 1 μm to 30 μm.

(9) The separator according to any one of (1) to (8), further comprising a parylene deposition layer covering the whole surface of said separator.

(10) A device for lipid bilayer membrane formation, including said separator according to any one of (1) to (9) and a chamber with two wells separated by said separator.

(11) A method of producing said separator for forming a lipid bilayer membrane according to (1), comprising the steps of:
  providing said thin film whose one surface is covered by a supporting film;
  forming said one or more through holes with a tapered cross-sectional shape by subjecting said thin film to selective etching;
  applying a photosensitive resin layer to cover the whole area of said thin film on the surface opposite to that covered by said supporting film;
  detaching said supporting film;
  applying a photosensitive resin layer to cover the whole area of said thin film on the surface exposed following the detachment of said supporting film;
  subjecting said photosensitive resin layers on the both surfaces of said thin film to selective photoetching for selective removal of said photosensitive resin that fills each of said through holes and of said photosensitive resin at the periphery of each of said through holes; and
  heating both said photosensitive resin layers to form said reinforcing layers.

(12) The method according to (11), wherein said thin film is composed of a polyimide resin.

(13) The method according to (11) or (12), wherein said reinforcing layers are composed of a polyimide resin.

(14) The method according to any one of (11) to (13), wherein said photosensitive resin layers are heated under vacuum.

(15) A method of forming a lipid bilayer membrane, comprising the steps of: providing said device for lipid bilayer membrane formation according to (10); adding a lipid bilayer membrane-forming lipid solution to each of said wells to fill each well with said lipid solution; and adding water or an aqueous solution to each of said wells to form droplets of water or said aqueous solution in the lipid solution to form a lipid bilayer membrane in each of said through holes.

Effects of the Invention

A lipid bilayer membrane formed by using the separator of the present invention has excellent properties, as demonstrated by a small current noise measured across a lipid bilayer membrane including a protein that forms a nanopore functioning as an ion channel, as specifically described in Examples below. The separator of the present invention can be produced mainly by wet etching, and is thus produced through a simple process and can be manufactured using an inexpensive general-purpose machine without need of expensive equipment. Furthermore, the capability to produce many separators on one thin film at a time as well as the simple production process makes it possible to manufacture the separator of the present invention in a large scale.

DETAILED DESCRIPTION OF THE INVENTION

Figure 1:
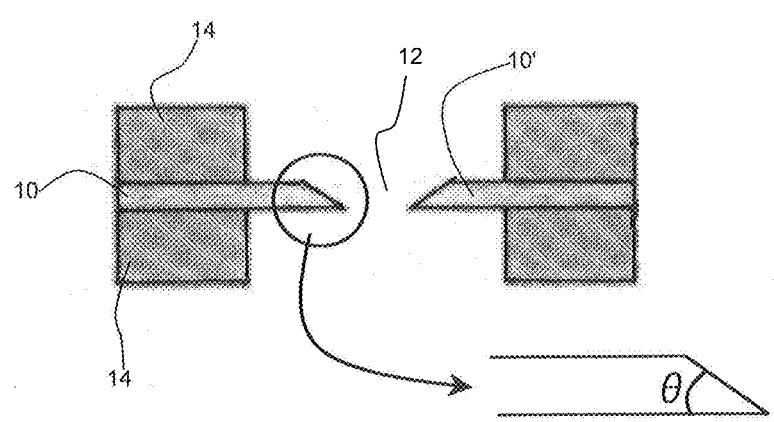
FIG. 1 shows a schematic cross-sectional end view depicting a through hole and its vicinity in one embodiment of the separator of the present invention.

FIG. 1 shows a schematic cross-sectional end view depicting a through hole and its vicinity in one embodiment of the separator of the present invention. The ratios between the sizes of components are different from the actual ratios, for convenience.

The separator includes a thin film 10. The thin film 10 is composed of a resin capable of being wet-etched. The phrase "composed of a resin capable of being wet-etched" as used herein means "made from a resin capable of being wet-etched," by which it is meant that the thin film in a final product is not necessarily capable of being wet-etched. The thin film 10 can be composed of, for example, a polyimide resin, an acrylic resin, or an epoxy resin. Among those, a polyimide resin is preferred from the viewpoint of the properties of a formed lipid bilayer membrane (for example, the current noise as described above). The "polyimide resin" means a resin mainly composed of polyimide (at a ratio of not less than 50% by mole, preferably not less than 90% by mole, more preferably not less than 95% by mole, most preferably 100% by mole). The "resin" may contain additives that are often added to resins, such as plasticizer, antistatic agent, and inorganic particles, to an extent that will give no adverse effect to the effects of the present invention. The total content of such additives is normally not more than 10% by weight, preferably not more than 5% by weight. The thickness of the thin film 10 is normally from 1 μm to 30 μm, preferably from 5 μm to 20 μm, and particularly preferably from 5 μm to 10 μm. Additionally, the resin may be a resin that is cured into a polyimide resin by subsequent heat treatment. Thus, the resin may be a polyimide precursor resin, such as a polyamic acid.

The thin film 10 has one or more through holes 12. Each lipid bilayer membrane formed in each through hole 12 has a very thin thickness of about 5 nm. Thus, each through hole 12 preferably has a small hole diameter to prevent the lipid bilayer membrane from collapsing due to, for example, vibration. On the other hand, because a part composed of an oil is formed along the periphery of each lipid bilayer membrane formed in each through hole 12, the formation of a lipid bilayer membrane is hindered if each through hole 12 has a too small hole diameter. Thus, the hole diameter of each through hole 12 is preferably from about 30 μm to 300 μm, more preferably from about 30 μm to 150 μm. The "hole diameter" of a tapered through hole means the diameter of the part at which the diameter is the smallest in the through hole. The ratio of the thickness of the thin film 10 to the hole diameter of each through hole 12 (aspect ratio) is preferably 1/50 to 1/5, more preferably from 1/50 to 1/10, from the viewpoint of ease of formation of a lipid bilayer membrane with excellent properties.

The through hole 12 has a tapered cross-sectional shape (in which the hole diameter varies continuously and one-sidedly along the thickness direction of the separator), as shown in the figure. An encircled portion in FIG. 1 is enlarged and displayed at the lower right of FIG. 1. The angle θ displayed in this figure represents the "taper angle" of the through hole, and the taper angle is preferably not more than 80 degrees, more preferably not more than 60 degrees. On the other hand, a through hole with an extremely small taper angle is difficult to prepare. Thus, the taper angle is normally not less than 10 degrees, preferably not less than 15 degrees. In addition, the taper angle within the above-described range can be achieved when a through hole is formed by wet etching as described below.

Reinforcing layers 14 covering the thin film 10 and made of a resin capable of being wet-etched are provided on both surfaces of the thin film 10. The phrase "composed of a resin capable of being wet-etched" as used herein means "made from a resin capable of being wet-etched," by which it is meant that the reinforcing layers in a final product are not necessarily capable of being wet-etched. The reinforcing layers 14 can be composed of, for example, a polyimide resin, an acrylic resin, or an epoxy resin, and is preferably composed of the same resin as that used in the thin film 10 because it causes the reinforcing layers to share the same thermal expansion coefficient with the thin film and prevents deformation and detachment due to temperature change. Because thin film 10 is preferably composed of a polyimide resin as described above, the reinforcing layers 14 are preferably composed of a polyimide resin. In this respect, the description of the "polyimide resin" is the same as above, but the reinforcing layers are preferably composed of a photosensitive polyimide resin for the convenience in the production process as described below. The photosensitive polyimide resin may be a resin that is cured into a polyimide resin by subsequent heat treatment. Thus, the polyimide resin may be a polyimide precursor resin, such as a polyamic acid.

The reinforcing layers 14 are formed to cover neither the area of each through hole 12 nor the periphery 10' of each through hole 12. By this, the thickness of each through hole 12, in which a lipid bilayer membrane is formed, can be limited to the thickness of the thin film 10, which can ensure that the reinforcing layers 14 are not involved in lipid bilayer membrane formation at all. On the other hand, sufficient mechanical strength can be achieved by limiting the areas not covered by the reinforcing layers 14 to the areas of each through hole 12 and the periphery 10' of each through hole 12. The outline of the periphery 10' is normally, but is not limited to, a circle. The "periphery 10' of each through hole 12" is preferably has a calculated diameter ranging from 5 to 50 times, more preferably from 10 to 30 times, greater than the thickness of the reinforcing layers. In this respect, when the outline of the periphery 10' is a circle, the "calculated diameter" means the diameter of the circle; when the outline of the periphery 10' is not a circle, the "calculated diameter" means the diameter of a circle whose area is equal to the sum of the areas of the periphery and the through hole.

Furthermore, parylene may be optionally deposited onto the whole surface of an obtained separator by chemical vapor deposition (CVD). The thickness of the deposited parylene is preferably from 10 nm to 500 nm, particularly preferably from 50 nm to 200 nm. The deposition of parylene can improve the baseline of the current (the insulation performance) which is measured across a lipid bilayer membrane including a protein that forms a nanopore functioning as an ion channel.

An example of the method of producing the embodiment of the separator of the present invention shown in FIG. 1 will now be described by reference to FIG. 2. Detailed conditions are described in Examples below.

First, a thin film 10 is provided. A commercial product is conveniently used as the thin film 10. Since the thin film 10 itself is thin, low in mechanical strength, and difficult to handle, a film covered with a supporting film (such as a polyester film) on one surface is employed. In addition, a multilayer film including a polyimide thin film used as an insulating film and a copper layer formed on the polyimide thin film can be produced as a film for preparing a wire layer in electronic components, and such a copper layer-laminated polyimide film can also be suitably used. An example in which such a copper layer-laminated polyimide film is used will now be described.

Figure 2:
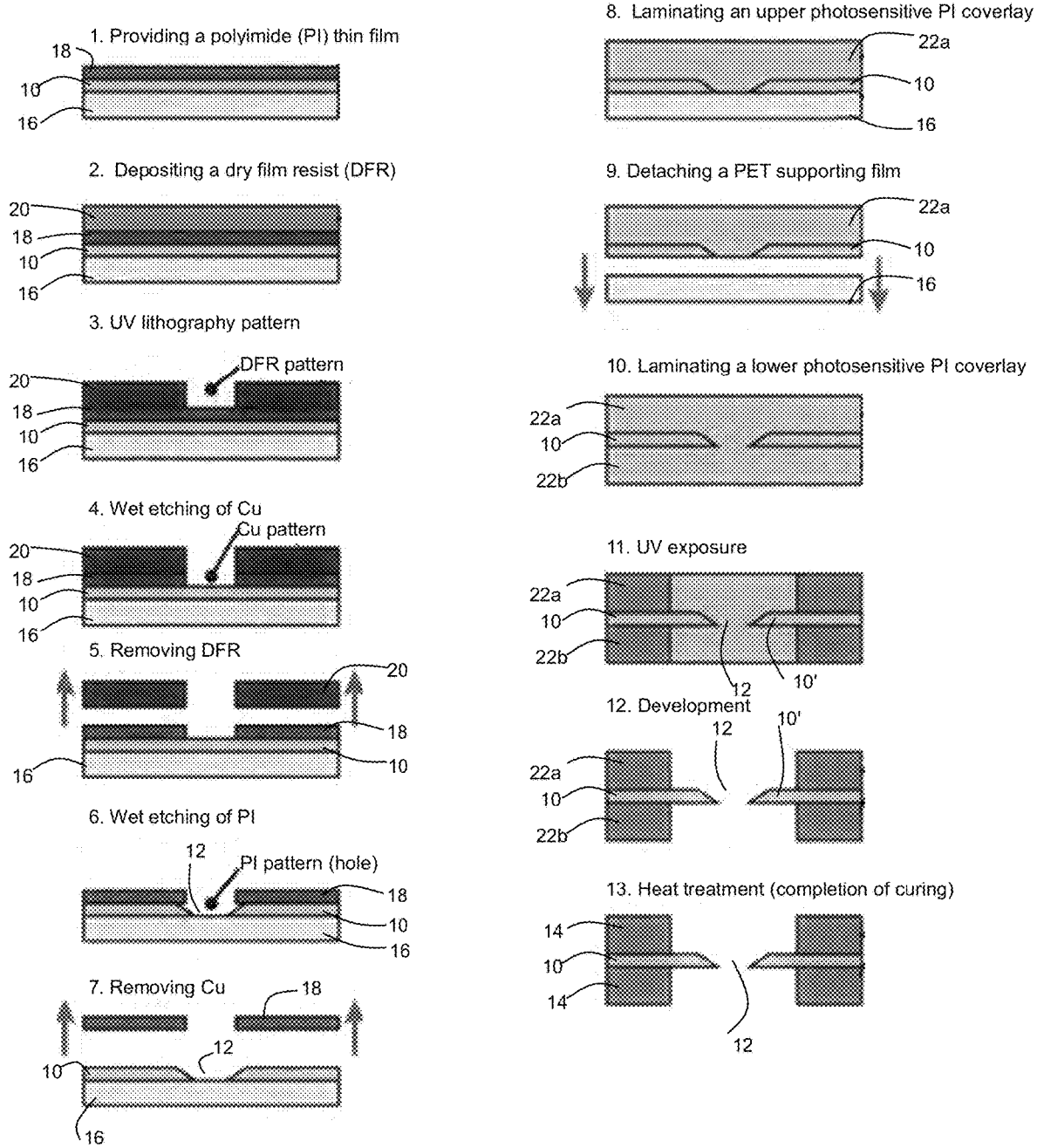
FIG. 2 is schematic diagram to explain an example of the method of producing the embodiment of the separator of the present invention shown in FIG. 1.

As shown in FIG. 2-1, a film including a supporting film 16 (such as a polyethylene terephthalate (PET) film), a polyimide thin film 10 laminated on the supporting film, and a copper layer 18 laminated on the polyimide thin film is provided.

Next, as shown in FIG. 2-2, a dry film resist (DFR) 20 is laminated on the copper layer 18. A photoresist may be applied instead of a DFR, but laminating a DFR is easier.

Next, as shown in FIG. 2-3, the DFR 20 is selectively exposed to ultraviolet light and then developed to form a pattern. In the following steps, a through hole 12 is formed in the portion of the thin film 10, where the DFR 20 is removed during the development process.

Next, as shown in FIG. 2-4, using the selectively patterned DFR 20 as a mask, the copper layer 18 is selectively etched.

Next, as shown in FIG. 2-5, the DFR 20 is entirely removed.

Next, as shown in FIG. 2-6, using the selectively etched copper layer 18 as a mask, the polyimide thin film 10 is selectively etched to form the through hole 12.

Next, as shown in FIG. 2-7, the copper layer 18 is entirely removed by etching.

Next, as shown in FIG. 2-8, a coverlay 22a, which is composed of a photosensitive polyimide resin, is laminated on the polyimide thin film 10. The coverlay 22a is preferably in film form for convenience and, in that case, can be laminated using, for example, a roll laminator. However, the coverlay 22a can also be formed by applying a varnish made of a photosensitive polyimide resin.

Next, as shown in FIG. 2-9, the supporting film 16 is detached.

Next, as shown in FIG. 2-10, a coverlay 22b, which is composed of the same photosensitive polyimide resin as that for the coverlay 22a, is laminated, similarly to the coverlay 22a, on the exposed surface of the polyimide thin film 10, following the detachment of the supporting film 16.

Next, as shown in FIG. 2-11, the coverlays 22a and 22b, excluding the areas covering the through hole 12 and the periphery 10' thereof, are exposed to ultraviolet light.

Next, as shown in FIG. 2-12, the coverlays 22a and 22b are developed to remove the areas of the coverlays 22a and 22b covering the through hole 12 and the periphery 10' thereof to expose the through hole 12 and the periphery 10' thereof.

Next, as shown in FIG. 2-13, the coverlays 22a and 22b are completely cured by a heat treatment to form reinforcing layers 14. The heat treatment may be conducted under atmosphere or vacuum, and is preferably conducted under vacuum from the viewpoint of forming a lipid bilayer membrane with excellent properties. The heat treatment temperature is normally from about 150° C. to 250° C., preferably from about 160° C. to 190° C. The heat treatment time is preferably from about 50 minutes to 3 hours, more preferably from about 1 hour to 2 hours.

Furthermore, in cases where parylene is deposited, parylene is vapor-deposited on the whole surface of the obtained separator using a CVD apparatus.

According to the above method, all the etching processes are wet etching processes, and a separator of the present invention can be produced just by ultraviolet exposure, wet etching, and heat treatment. Thus, a separator of the present invention can be easily and simply manufactured using a general-purpose machine. Further, many (for example, several hundred) separators can be produced in one polyimide thin film at a time. Thus, the above method is also suitable for large-scale production.

The separator for lipid bilayer membrane formation of the present invention can be used in the same manner as a conventional separator for lipid bilayer membrane formation. That is, the separator of the present invention can be used to separate a chamber into two wells, to produce a device for lipid bilayer membrane formation. For example, but not limited to, a well-known double-well chamber as described in Patent Document 1 can be suitably used as the chamber. Accordingly, the present invention provides such a novel device for bilayer membrane formation.

A method of forming a lipid bilayer membrane by using the device for lipid bilayer membrane formation of the present invention can be carried out by a well-known method (for example, the method described in Patent Document 1 or 2 above), except that the above-described device for lipid bilayer membrane formation of the present invention is used as a device for lipid bilayer membrane formation. That is, a lipid bilayer membrane can be formed, for example, as follows.

A solution of a lipid bilayer membrane-forming lipid is added to each of the above-described two wells to fill each well with the lipid solution. In this respect, the lipid bilayer membrane-forming lipid may be a well-known phospholipid used for liposome formation, and is preferably identical or similar in properties to lipids in biological membranes, to mimic reactions that occur in biological membranes. Preferred examples of the lipid include phospholipids that are conventionally and widely used in the art, such as diphytanoyl phosphatidylcholine (DPhPC), dipalmytoyl phosphatidylcholine, 1-palmitoyl 2-oleoyl phosphatidylcholine (POPC), and dioleoyl phosphatidylcholine (DOPC). Many of those lipids are commercially available, and a commercially available lipid can be suitably used. Additionally, an asymmetric membrane can also be easily formed by adding different lipids to the two wells.

The concentration of the phospholipid in the solution used for lipid bilayer membrane formation is not specifically limited, provided that a lipid bilayer membrane can be formed at that concentration. The concentration of the phospholipid is normally from about 5 g/L to 30 g/L, preferably from about 10 g/L to 20 g/L. The solvent in the phospholipid solution is not specifically limited, and is preferably an organic solvent and is preferably an aliphatic hydrocarbon solvent such as n-decane.

Next, water or an aqueous solution is added to each well to form a droplet of water or the aqueous solution in the lipid solution. For example, the tip of a micropipette is submerged into the lipid solution filled in each well to form a droplet of water or the aqueous solution. The liquid used to form droplets in this step may be pure water or an aqueous solution such as an aqueous buffer solution (i.e., a buffer solution containing water as a main solvent). The volume of water or the aqueous solution added to each well is not specifically limited, and is preferably about 1 to 20 times, more preferably about 1 to 10 times, still more preferably about 1 to 5 times, yet more preferably about 1.5 to 3 times, greater than the volume of the lipid solution filled in each well, from the viewpoint of efficiently forming a lipid bilayer membrane.

The lipid bilayer membrane is suitably used in various measurements to study the properties or functions of proteins anchored in the lipid bilayer membrane or to screen ligands of the proteins and study the properties of the ligands, which bind to the proteins and changes the bioactivities of the proteins. Thus, the lipid bilayer membrane preferably includes a protein, particularly a transmembrane protein that is anchored in biological membranes and function in vivo. Various receptors and enzymes can be the proteins anchored in the lipid bilayer membrane, including, for example, but not limited to, peptides/proteins, such as α-hemolysin, gramicidin, and alamethicin; and various ion channel and ABC transporter proteins. When the protein is water-soluble, an aqueous solution of the protein is preferably used, and an aqueous solution of the protein in an aqueous buffer solution is more preferably used, as the above-described aqueous solution. The concentration of the protein in these solutions is not specifically limited and can be appropriately selected, and is normally from about 1 nM to 1 mM, preferably from about 0.1 μM to 10 μM. The protein may be contained in an aqueous solution added to one of the two wells, or in an aqueous solution added to both the wells. In cases where the protein anchored in the lipid bilayer membrane is fat-soluble, the membrane protein expressed in proteoliposomes can be fused with a lipid membrane in the device of the present invention and then used.

Once droplets described above are formed in the lipid solution, the lipid solution is pressed onto the separator, and the lipid solution layer and the water layers come to contact with each other at the separator under certain pressure. During this process, a lipid bilayer membrane is formed in the through hole of the separator. The lipid bilayer membrane is formed by keeping the droplets of water or the aqueous solution intact normally for about 3 minutes to 1 hour in a stationary state, such that the formed bilayer membrane covers the through hole of the separator.

In cases where the protein is a protein that forms an ion channel, such as α-hemolysin or alamethicin, when the protein is correctly anchored in the lipid bilayer membrane, an ion channel is formed, so that the two wells are electrically connected. Accordingly, whether or not a lipid bilayer membrane in which the protein is correctly anchored is formed can be determined by applying a prescribed voltage between the two wells and measuring the current across the lipid bilayer membrane. Additionally, various substances can also be applied to the protein to screen a substance that induce a conformational change in the protein to close or open the ion channel. Such a substance potentially exerts a certain bioactivity and can be a drug candidate. Thus, it is often desired to measure the current running between the two wells. An electrode is placed on the top surface of a bottom plate, which is configured to be the bottom of each well, and the electrodes are connected to the outside of the wells, whereby the wells can be easily wired.

The present invention will now be specifically described by way of examples. However, the present invention is not limited to the following examples.

1. Example 1: Production of Separators

A preferred example of the separator of the present invention was produced by the above production method shown in FIG. 2, specifically as follows.

A multilayer film including a PET film (a supporting film 16) with a thickness of 50 μm, a polyimide thin film 10 of Kapton 30EN (trademark, manufactured by Du Pont-Toray Co., Ltd.) with a thickness of 7.5 μm laminated on the PET film, and a copper layer 18 with a thickness of 5 μm laminated on the polyimide thin film was provided (FIG. 2-1). The size of the multilayer film used was 250 mm square.

Next, a DFR 20 with a thickness of 25 μm was laminated on the copper layer 18 at 110° C. under atmosphere by using a roll laminator at a rate of 20 cm/min (FIG. 2-2).

The resulting multilayer film was exposed to ultraviolet light at an energy of 80 mJ/cm$^2$ in contact exposure mode by using a parallel-light exposure machine, developed by spraying of 1% sodium carbonate solution, and then washed with water (FIG. 2-3).

Using the patterned DFR 20 as a mask, selected regions of the copper layer 18 were removed with an alkaline copper etchant (FIG. 2-4).

The resulting multilayer film was immersed in a DFR-removing solution at 60° C. for 1 minute to swell and then entirely remove the DFR 20 (FIG. 2-5).

Using the patterned copper layer 18 as a mask, the polyimide thin film 10 was subjected to selective etching in a commercially available polyimide etchant (TPE3000; manufactured by Toray Engineering Co., Ltd.), to form through holes 12 (FIG. 2-6).

The copper layer 18 was entirely removed with an alkaline copper etchant (FIG. 2-7).

Two layers of a coverlay 22a with a thickness of 30 μm (a total of 60 μm in film thickness), composed of a commercially available photosensitive polyimide film, were laminated to the polyimide thin film 10 under atmosphere by using a roll laminator (FIG. 2-8).

The supporting PET film was detached by hand (FIG. 2-9).

Two layers of a coverlay 22b with a thickness of 30 μm (a total of 60 μm in film thickness), composed of a commercially available photosensitive polyimide film, were laminated to the polyimide thin film 10 under atmosphere by using a roll laminator (FIG. 2-10).

The resulting multilayer film was exposed simultaneously on both sides to ultraviolet light at an energy of 550 mJ/cm$^2$ in contact exposure mode by using a scattered-light exposure machine (FIG. 2-11). The whole area of the multilayer film, excluding the areas covering the through holes 12 and the peripheries 10' thereof, was exposed to ultraviolet light. The number of the formed through holes 12 was 11 in this example.

The resulting multilayer film was developed simultaneously on both sides by spraying of 1% sodium carbonate aqueous solution, and then washed with water (FIG. 2-12).

The coverlays 22a and 22b were completely cured by heating at 180° C. under vacuum for 1 hour, to form the reinforcing layers 14 (FIG. 2-13).

In the thus-prepared separator, the through holes had a hole diameter of 100 μm; the peripheries of the through holes (the areas where the reinforcing layers 14 are not formed) had a diameter of 1.2 mm; the aspect ratio was about 1/20; and the taper angle was from 40 to 60 degrees. Totally 280 separators each having 11 through holes were produced on a polyimide thin film of 250 mm square at a time. Seven hours were required from the start to the completion of the task.

2. Example 2

Parylene was vapor-deposited on the whole surface of a separator produced in Example 1, using a CVD apparatus. The thickness of the vapor-deposited parylene layer was 100 nm.

3. Comparative Example 1

One through hole with a diameter of 600 μm was formed in a poly(methyl methacrylate) film with a thickness of about 75 μm by using a microdrill to produce a separator.

4. Comparative Example 2

Eleven through holes with a hole diameter of 100 μm were formed in a parylene film with a thickness of 5 μm by UV lithography. The parylene film was covered on both sides with supporting films (acrylic resin films with a thickness of about 75 μm), except for a rectangular region in which the 11 formed through holes are formed. That is, two supporting film from which areas corresponding to the rectangular region had been cut off were prepared and attached to the parylene film on both sides with an adhesive, and then dried. From the time required to produce 5 separators of this comparative example, it is roughly calculated that the time required to produce 280 separators of this comparative example, which is the number of separators that can be produced in Example 1, is at least 30 hours.

5. Performance Test (1) Production of Devices for Lipid Bilayer Membrane Formation The separators of Examples 1 and 2 and Comparative Examples 1 and 2 were individually integrated into double-well chambers, in which each well had a diameter of 4 mm and a depth of 3 mm (see Patent Document 1), to produce devices for lipid bilayer membrane formation. An Ag/AgCl electrode was placed on the bottom surface of each well.

(2) Formation of Lipid Bilayer Membranes

First, 1 to 5 μL of a lipid solution (containing diphytanoyl phosphatidylcholine (DPhPC) at a concentration of 20 mg/mL in n-decane) was added to each well. Next, an aqueous solution containing a membrane protein (0.1 nM or 1 nM α-hemolysin, 1 M KCl, 10 mM phosphate buffer, pH 7; 18 to 25 μL) was added to each well and left to stand. Lipid monolayers are formed on the surface of the respective formed droplets, and the droplets make contact with each other in each through hole of each separator, in which a lipid bilayer membrane is formed (droplet contact method). The lipid bilayer membrane formation can be confirmed by a step-wise signal observed in conjunction with reconstitution of the membrane protein, α-hemolysin, in the membrane (incorporation of α-hemolysin into the lipid bilayer membrane) (see Patent Document 1).

(3) Evaluation

A chip with one of the above double-well chambers for the droplet contact method was connected to a patch-clamp amplifier (PICO2; Tecella LLC) to measure the current under voltage-clamp conditions. A sampling frequency of 5 kHz (Bessel low-pass filter: 1 kHz) was employed. The gain was 10 mV/pA, while the applied voltage was 50 mV. As described above, upon reconstitution of α-hemolysin in the lipid bilayer membrane, a nanometer-size pore (nanopore) is opened in the lipid bilayer membrane. An increase in electrical current corresponding to 1 nS (1 GOhm) is observed under the present experimental conditions. The measurement was repeated a sufficient number of times, and the standard deviation for the current signals observed for 1 second or longer after the lipid bilayer membrane formation and just before the nanopore formation (RMS noise) was used as an evaluation reference. A small electrical current (about 1 pA at minimum) is obtained as an output in the functional analysis of a membrane protein or in a sensor. In cases where the value of RMS noise is large, an appropriate output S/N ratio is not obtainable. Thus, a smaller value of RMS noise is considered as reflecting higher performance.

(4) Results

The results are presented in Table 1 below.

TABLE 1

| Examples | RMS noise* | Sample number |
| --- | --- | --- |
| Comparative Example 1 | 0.58 ± 0.48 | 19 |
| Comparative Example 2 | 0.31 ± 0.12 | 22 |
| Example 1 | 0.28 ± 0.05 | 19 |
| Example 2 | 0.29 ± 0.06 | 13 |

*mean ± standard deviation (pA rms)

As shown in Table 1, the values of RMS noise obtained by using the separators of Examples in the present invention were smaller than those obtained by using the separators of Comparative Examples, indicating that use of the separators obtained in Examples enables accurate measurement. The separator of Comparative Example 2 shows a considerably high performance, but the RMS noise is still lower in Examples 1 and 2. Additionally, the separator of Comparative Example 2 is difficult to produce by large-scale production. On the other hand, 280 separators of Example 1 were successfully produced for 7 hours at a time.

DESCRIPTION OF SYMBOLS

10 thin film
10' periphery of a through hole
12 through hole
14 reinforcing layer
16 supporting film
18 copper layer
20 dry film resist (DFR)
22a coverlay
22b coverlay

The invention claimed is:

1. A method of producing a separator for forming a lipid bilayer membrane, said separator comprising a thin film having one or more through holes and made of a resin capable of being wet-etched, and reinforcing layers covering both surfaces of said thin film and made of a resin capable of being wet-etched, wherein said reinforcing layers cover a whole area of said thin film except for said through holes and peripheries thereof, and each of said through holes has a tapered cross-sectional shape;

said method comprising the steps of:
providing said thin film whose one surface is covered by a supporting film;
forming said one or more through holes with a tapered cross-sectional shape by subjecting said thin film to selective etching;
applying a photosensitive resin layer to cover the whole area of said thin film on the surface opposite to that covered by said supporting film;
detaching said supporting film;
applying a photosensitive resin layer to cover the whole area of said thin film on the surface exposed following the detachment of said supporting film;
subjecting said photosensitive resin layers on the both surfaces of said thin film to selective photoetching for selective removal of said photosensitive resin that fills each of said through holes and of said photosensitive resin at the periphery of each of said through holes; and
heating both said photosensitive resin layers to form said reinforcing layers.

2. The method according to claim 1, wherein said thin film is composed of a polyimide resin.

3. The method according to claim 1, wherein said reinforcing layers are composed of a polyimide resin.

4. The method according to claim 1, wherein said photosensitive resin layers are heated under vacuum.

\* \* \* \* \*